United States Patent
Lin et al.

(10) Patent No.: US 9,598,772 B2
(45) Date of Patent: Mar. 21, 2017

(54) METHOD FOR FABRICATING BUMP STRUCTURE WITHOUT UBM UNDERCUT

(75) Inventors: Chih-Wei Lin, Xinfeng Township (TW); Ming-Da Cheng, Jhubei (TW); Wen-Hsiung Lu, Jhonghe (TW); Chung-Shi Liu, Shinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 89 days.

(21) Appl. No.: 12/761,863

(22) Filed: Apr. 16, 2010

(65) Prior Publication Data

US 2011/0254151 A1  Oct. 20, 2011

(51) Int. Cl.
*H01L 23/498*  (2006.01)
*H01L 21/3205*  (2006.01)
(Continued)

(52) U.S. Cl.
CPC ........ *C23C 18/1605* (2013.01); *C23C 18/165* (2013.01); *H01L 24/03* (2013.01); *H01L 24/11* (2013.01); *H01L 23/3192* (2013.01); *H01L 24/05* (2013.01); *H01L 24/13* (2013.01); *H01L 24/16* (2013.01); *H01L 24/81* (2013.01); *H01L 2224/03464* (2013.01); *H01L 2224/03912* (2013.01); *H01L 2224/0401* (2013.01); *H01L 2224/05572* (2013.01); *H01L 2224/05647* (2013.01); *H01L 2224/1145* (2013.01); *H01L 2224/1147* (2013.01); *H01L 2224/11452* (2013.01); *H01L 2224/11462* (2013.01); *H01L 2224/11464* (2013.01); *H01L 2224/11849* (2013.01); *H01L 2224/13082* (2013.01); *H01L 2224/13083* (2013.01); *H01L 2224/13111* (2013.01); *H01L 2224/13139* (2013.01);
(Continued)

(58) Field of Classification Search
CPC . H01L 2224/05647; H01L 2924/01046; H01L 2224/03464; H01L 2224/03912; H01L 2224/0401; H01L 2224/05572; H01L 2224/1145; H01L 2224/11452; H01L 2224/11462; H01L 2224/11464; H01L 2224/1147; H01L 2224/11849; H01L 2224/13; H01L 2224/81447; H01L 23/3192; H01L 24/13; H01L 24/16; H01L 24/81; C23C 18/1605
USPC ........................................................ 257/737
See application file for complete search history.

(56) References Cited

U.S. PATENT DOCUMENTS 7,262,505 B2 * 8/2007 Ahn et al. .................... 257/762
7,456,090 B2   11/2008 Chang et al.
(Continued)

OTHER PUBLICATIONS

Office Action from corresponding application No. CN 201010530393.9.
(Continued)

*Primary Examiner* — A. Sefer
*Assistant Examiner* — Benjamin Tzu-Hung Liu
(74) *Attorney, Agent, or Firm* — Hauptman Ham, LLP

(57) ABSTRACT

A method for fabricating bump structure without UBM undercut uses an electroless Cu plating process to selectively form a Cu UBM layer on a Ti UBM layer within an opening of a photoresist layer. After stripping the photoresist layer, there is no need to perform a wet etching process on the Cu UBM layer, and thereby the UBM structure has a non-undercut profile.

20 Claims, 6 Drawing Sheets

(51) Int. Cl.
*C23C 18/16* (2006.01)
*H01L 23/00* (2006.01)
*H01L 23/31* (2006.01)

(52) U.S. Cl.
CPC ............... *H01L 2224/13144* (2013.01); *H01L 2224/13155* (2013.01); *H01L 2224/13164* (2013.01); *H01L 2224/16145* (2013.01); *H01L 2224/16225* (2013.01); *H01L 2224/16227* (2013.01); *H01L 2224/81193* (2013.01); *H01L 2224/81447* (2013.01); *H01L 2924/0002* (2013.01); *H01L 2924/0103* (2013.01); *H01L 2924/0104* (2013.01); *H01L 2924/014* (2013.01); *H01L 2924/0105* (2013.01); *H01L 2924/01012* (2013.01); *H01L 2924/01013* (2013.01); *H01L 2924/01019* (2013.01); *H01L 2924/01023* (2013.01); *H01L 2924/01024* (2013.01); *H01L 2924/01025* (2013.01); *H01L 2924/01029* (2013.01); *H01L 2924/01032* (2013.01); *H01L 2924/01033* (2013.01); *H01L 2924/01038* (2013.01); *H01L 2924/01047* (2013.01); *H01L 2924/01049* (2013.01); *H01L 2924/01072* (2013.01); *H01L 2924/01073* (2013.01); *H01L 2924/01078* (2013.01); *H01L 2924/01079* (2013.01); *H01L 2924/01082* (2013.01); *H01L 2924/1305* (2013.01); *H01L 2924/1306* (2013.01); *H01L 2924/13091* (2013.01); *H01L 2924/14* (2013.01)

(56) References Cited

U.S. PATENT DOCUMENTS

| | | | | |
|---|---|---|---|---|
| 7,709,957 | B2* | 5/2010 | Ishii | 257/758 |
| 7,977,789 | B2* | 7/2011 | Park | 257/737 |
| 8,039,960 | B2* | 10/2011 | Lin | 257/738 |
| 2006/0094224 | A1* | 5/2006 | Huang et al. | 438/612 |
| 2007/0238283 | A1* | 10/2007 | Chen et al. | 438/613 |
| 2009/0079094 | A1 | 3/2009 | Lin | |
| 2009/0108443 | A1* | 4/2009 | Jiang | 257/737 |

OTHER PUBLICATIONS

Office Action dated Sep. 23, 2013 from corresponding application No. TW 009134856.
Office Action dated Jun. 26, 2013 from corresponding application No. CN 201010530393.9.
Office Action dated Dec. 12, 2013 from corresponding application No. TW 009134856.

* cited by examiner

METHOD FOR FABRICATING BUMP STRUCTURE WITHOUT UBM UNDERCUT

TECHNICAL FIELD

This disclosure relates to the fabrication of semiconductor devices, and more particularly, to a method of forming a bump structure without of under-bump metallurgy (UBM) undercut.

BACKGROUND

Modern integrated circuits are made up of literally millions of active devices such as transistors and capacitors. These devices are initially isolated from each other, but are later interconnected together to form functional circuits. Typical interconnect structures include lateral interconnections, such as metal lines (wirings), and vertical interconnections, such as vias and contacts. Interconnections are increasingly determining the limits of performance and the density of modern integrated circuits. On top of the interconnect structures, bond pads are formed and exposed on the surface of the respective chip. Electrical connections are made through bond pads to connect the chip to a package substrate or another die. Bond pads can be used for wire bonding or flip-chip bonding. In a typical bumping process, interconnect structures are formed on metallization layers, followed by the formation of under-bump metallurgy (UBM), and the mounting of solder balls.

Flip-chip packaging utilizes bumps to establish electrical contact between a chip's I/O pads and the substrate or lead frame of the package. Structurally, a bump actually contains the bump itself and a so-called under bump metallurgy (UBM) located between the bump and an I/O pad. An UBM generally contains an adhesion layer, a barrier layer and a wetting layer, arranged in this order on the I/O pad. The bumps themselves, based on the material used, are classified as solder bumps, gold bumps, copper pillar bumps and bumps with mixed metals. Recently, copper interconnect post technology is proposed. Instead of using solder bump, the electronic component is connected to a substrate by means of copper post. The copper interconnect post technology achieves finer pitch with minimum probability of bump bridging, reduces the capacitance load for the circuits and allows the electronic component to perform at higher frequencies. A solder alloy is still necessary for capping the bump structure and jointing electronic components as well.

Usually, in wet etching the UBM Cu layer, an isotropic etch profile is produced, in which the etching is at the same rate in all directions, leading to undercutting of the etched Cu material. This action results in an undesirable loss of line width. The undercut caused by wet Cu etching process will induce the stress concentration, resulting in bump sidewall delamination and bump crack. Although the undercut is an inherent result of the etching process, the undercut is detrimental to the long-term reliability of the interconnection. The undercut compromises the integrity of the solder bump structure by weakening the bond between the solder bump and the bonding pad of the chip, thereby leading to premature failure of the chip.

BRIEF DESCRIPTION OF THE DRAWINGS

The aforementioned objects, features and advantages of this disclosure will become apparent by referring to the following detailed description of the preferred embodiments with reference to the accompanying drawings, wherein.

DETAILED DESCRIPTION OF ILLUSTRATIVE EMBODIMENTS

This disclosure provides a bump process used in semiconductor devices having solder bumps, Cu posts, post passivation interconnects, and/or through-silicon vias (TSVs) fabricated thereon, applied to flip-chip assembly, wafer-level chip scale package (WLCSP), three-dimensional integrated circuit (3D-IC) stack, and/or any advanced package technology fields. In the following description, numerous specific details are set forth to provide a thorough understanding of the disclosure. However, one having an ordinary skill in the art will recognize that the disclosure can be practiced without these specific details. In some instances, well-known structures and processes have not been described in detail to avoid unnecessarily obscuring the disclosure. Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Herein, cross-sectional diagrams of FIGS. 1 to 7 depicting an exemplary embodiment of a method of forming a bump structure without UBM undercut.

Figure 1:
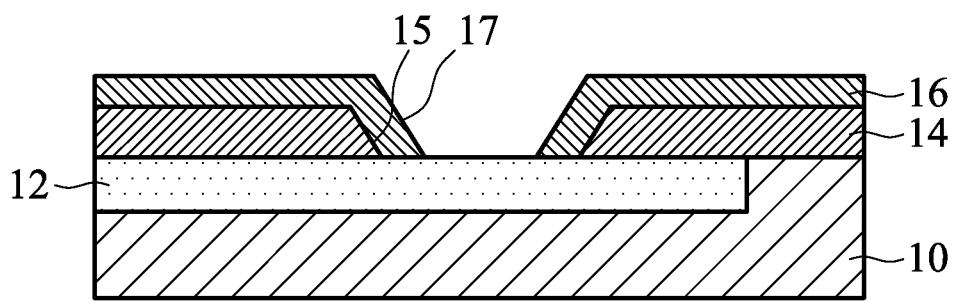
FIGS. 1 to 4, 4A, 4B and 5 to 7 are cross-sectional diagrams depicting an exemplary embodiment of forming a bump structure without UBM undercut.

With reference to FIG. 1, an example of a substrate 10 used for bump fabrication may comprise a semiconductor substrate as employed in a semiconductor integrated circuit fabrication, and integrated circuits may be formed therein and/or thereupon. The semiconductor substrate is defined to mean any construction comprising semiconductor materials, including, but is not limited to, bulk silicon, a semiconductor wafer, a silicon-on-insulator (SOI) substrate, or a silicon germanium substrate. Other semiconductor materials including group III, group IV, and group V elements may also be used. The substrate 10 may further comprise a plurality of isolation features (not shown), such as shallow trench isolation (STI) features or local oxidation of silicon (LOCOS) features. The isolation features may define and isolate the various microelectronic elements (not shown). Examples of the various microelectronic elements that may be formed in the substrate 10 include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; and other suitable elements. Various processes are performed to form the various microelectronic elements including deposition, etching, implantation, photolithography, annealing, and other suitable processes. The microelectronic elements are interconnected to form the integrated circuit device, such as a logic device, memory device (e.g., SRAM), RF device, input/ output (I/O) device, system-on-chip (SoC) device, combinations thereof, and other suitable types of devices.

The substrate 10 further includes inter-layer dielectric layers and a metallization structure overlying the integrated circuits. The inter-layer dielectric layers in the metallization structure include low-k dielectric materials, un-doped silicate glass (USG), silicon nitride, silicon oxynitride, or other commonly used materials. The dielectric constants (k value) of the low-k dielectric materials may be less than about 3.9, or less than about 2.8. Metal lines in the metallization structure may be formed of copper or copper alloys. One skilled in the art will realize the formation details of the metallization layers. A contact region 12 is a top metallization layer formed in a top-level inter-layer dielectric layer, which is a portion of conductive routs and has an exposed surface treated by a planarization process, such as chemical mechanical polishing (CMP), if necessary. Suitable materials for the conductive region 12 may include, but are not limited to, for example copper (Cu), aluminum (Al), AlCu, copper alloy, or other mobile conductive materials. In one embodiment, the contact region 12 is a metal pad region 12, which may be used in the bonding process to connect the integrated circuits in the respective chip to external features.

FIG. 1 also depicts a passivation layer 14 formed on the substrate 10 and patterned to form a first opening 15 exposing a portion of the metal pad region 12 for allowing subsequent bump formation. In one embodiment, the passivation layer 14 is formed of a non-organic material selected from un-doped silicate glass (USG), silicon nitride, silicon oxynitride, silicon oxide, and combinations thereof. In another embodiment, the passivation layer 14 is formed of a polymer layer, such as an epoxy, polyimide, benzocyclobutene (BCB), polybenzoxazole (PBO), and the like, although other relatively soft, often organic, dielectric materials can also be used.

FIG. 1 further depicts a polymer layer 16 that is formed on the passivation layer 14 and patterned to form a second opening 17 exposing a portion of the metal pad region 12 for allowing subsequent bump formation. The second opening 17 may be smaller than, equal to, or greater than the first opening 15. In one embodiment, the second opening 17 is positioned within the first opening 15. The polymer layer 16, as the name suggests, is formed of a polymer, such as an epoxy, polyimide, benzocyclobutene (BCB), polybenzoxazole (PBO), and the like, although other relatively soft, often organic, dielectric materials can also be used. In one embodiment, the polymer layer 16 is a polyimide layer. In another embodiment, the polymer layer 16 is a polybenzoxazole (PBO) layer. The polymer layer 16 is soft, and hence has the function of reducing inherent stresses on substrate. In addition, the polymer layer 16 is easily formed to thickness of tens of microns.

Figure 2:
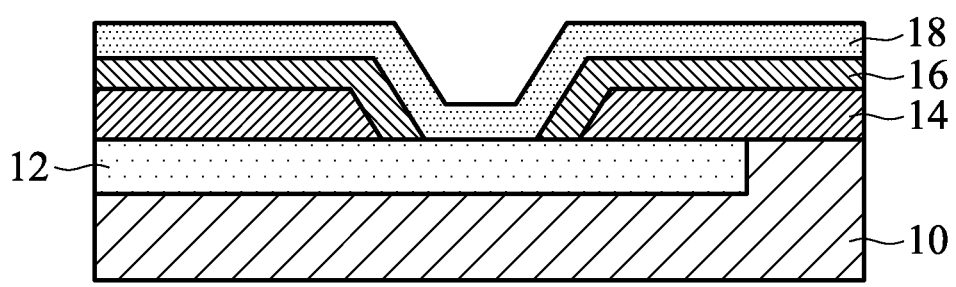

Referring to FIG. 2, the formation of a first under-bump-metallurgy (UBM) layer 18 is performed on the resulting structure. In details, the first UBM layer 18 is formed on the polymer layer 16 and the exposed portion of the metal pad region 12, and lines the sidewalls and bottom of the second opening 17. The first UBM layer 18, also referred to as a diffusion barrier layer, may be formed of titanium (Ti), titanium nitride (TiN), tantalum nitride (TaN), tantalum (Ta), or the like. The formation methods include physical vapor deposition (PVD) or sputtering. The first UBM layer 18 is deposited to a thickness of between about 500 and 2000 angstrom and more preferably to a thickness of about 1000 Angstrom.

Figure 3:
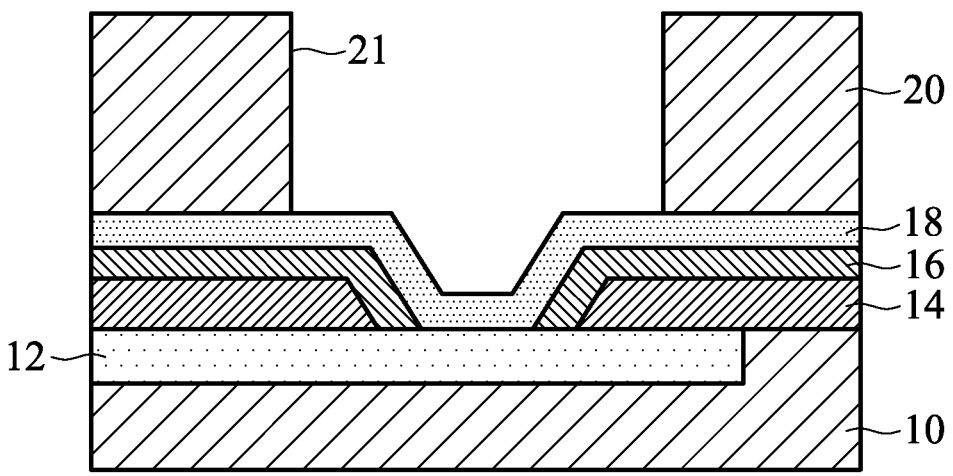

Next, in FIG. 3, a mask layer 20 is provided on the first UBM layer 18 and patterned with a third opening 21 exposing a portion of the first UBM layer 18 for bump formation. The diameter of the third opening 21 is greater or equal to the diameter of the second opening 17. The mask layer 20 is a dry film or a photoresist film through the steps of coating, curing, descum and the like, followed by lithography technology and etching processes such as a dry etch and/or a wet etch process.

Figure 4:
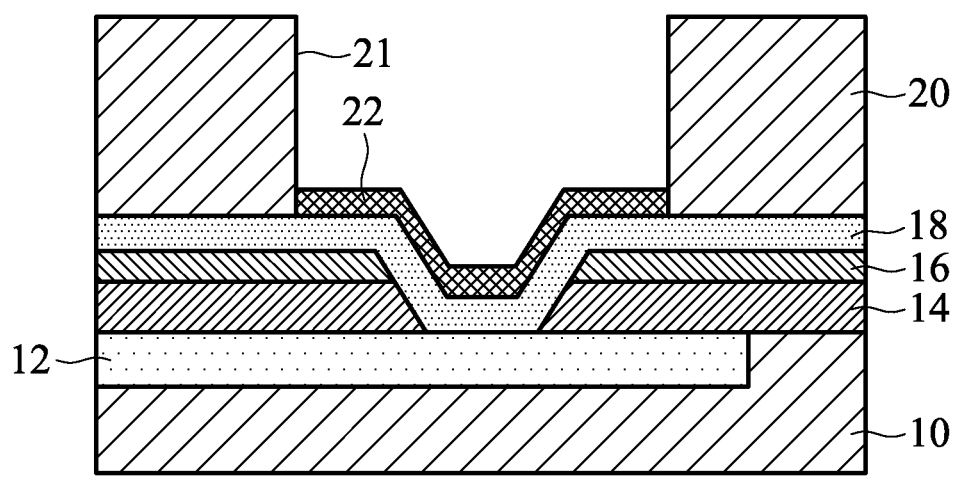

With reference to FIG. 4, a second UBM layer 22 is selectively formed on the first UBM layer 18 within the opening 21 of the mask layer 20 through an electroless deposition. In one embodiment, an electroless Cu deposition is performed to selectively plate a Cu layer on the exposed portion of the first UBM layer 18. The second UBM layer 22 has a thickness about 1~10 um, for example about 4~6 um, although the thickness may be greater or smaller.

In the electroless Cu plating, Palladium (Pd) is often used as the activated base metal for electroless copper plating. After activation, electroless deposition of Cu occurs on the catalytic surface. In general, the coverage of the Cu deposit reaches 100% and the adsorptive amount of Pd is greatly increased by the conditioning process. However, in order to insure uniformity, the diffusion barrier layer must substantially be free of any metal oxide they may have formed prior to the electroless Cu plating process.

Figure 4A:
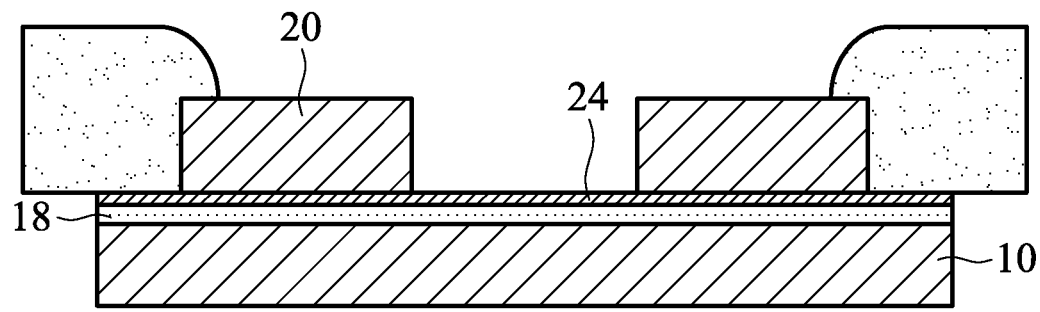
Figure 4B:
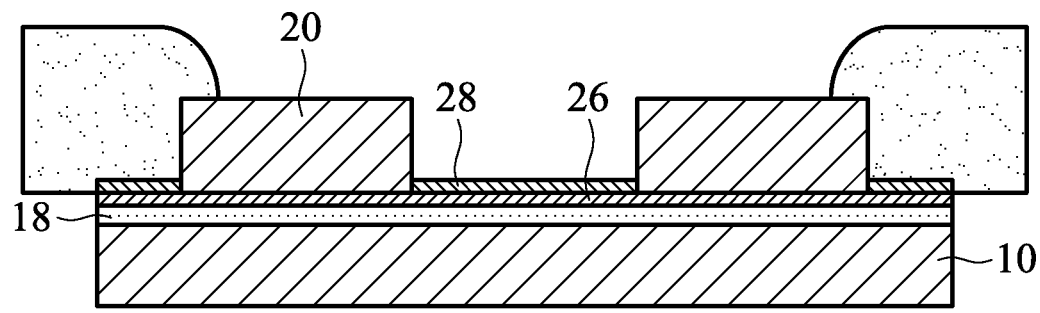

FIGS. 4A and 4B depicts an exemplary embodiment of performing an electroless Cu deposition on the first UBM layer 18. Once the substrate 10 has been transferred to the chamber for deposition, an activation or initiation step is performed. In some embodiments, the activation or initiation step is a palladium (Pd) activation or Pd initiation. The pretreatments used in the Cu electroless plating process include the removal of the titanium oxide ($TiO_2$) layer 24 from the diffusion barrier layer 18 using a HF solution, and the deposition of a Pd layer 26 to activate the diffusion barrier layer 18. Then an electroless plated Cu layer 28 on the non-uniform or rough Pd layer 26 exhibits high resistivity and RMS roughness. Thus the second UBM layer 22 includes a Cu UBM layer 28 and a Pd layer 26. Alternatively, the second UBM layer 22 is referred to as a Cu layer including Pd elements. The Pd element is detected at the interface between the first UBM layer 18 and the second UBM layer 28 by ICP and/or SEM-EDX.

Figure 5:
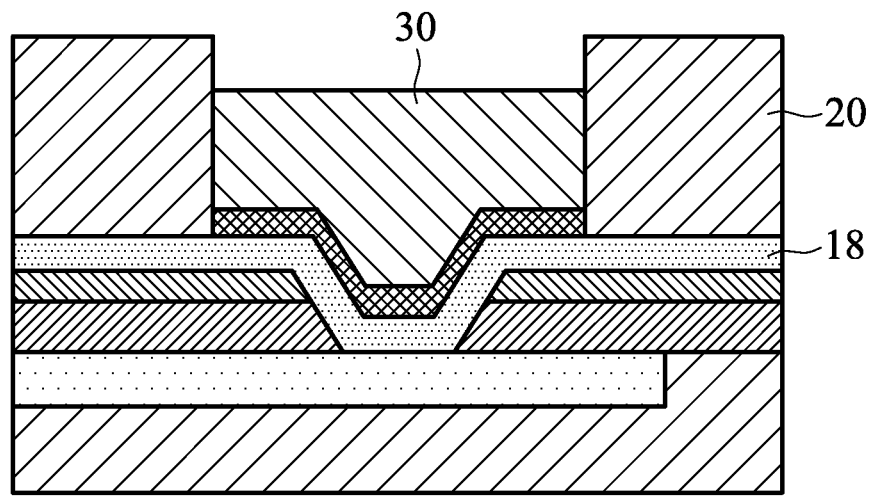
Figure 6:
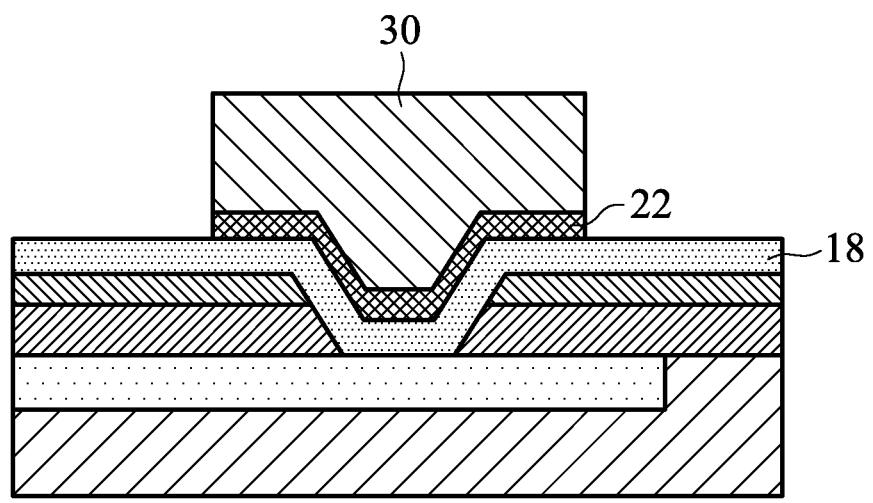

Referring to FIG. 5, a solder layer 30 is then formed on the second UBM layer 22 within the opening 21 of the mask layer 20. The solder layer 30 may be made of Sn, SnAg, Sn—Pb, SnAgCu (with Cu weight percentage less than 0.3%), SnAgZn, SnZn, SnBi—In, Sn—In, Sn—Au, SnPb, SnCu, SnZnIn, or SnAgSb, etc. Next, as shown in FIG. 6, the mask layer 20 is removed, exposing a portion of the first UBM layer 18. In the case the mask layer 20 is a dry film, it may be removed using an alkaline solution. If the mask layer 20 is formed of photoresist, it may be removed using acetone, n-methyl pyrrolidone (NMP), dimethyl sulfoxide (DMSO), aminoethoxy ethanol, and the like.

Figure 7:
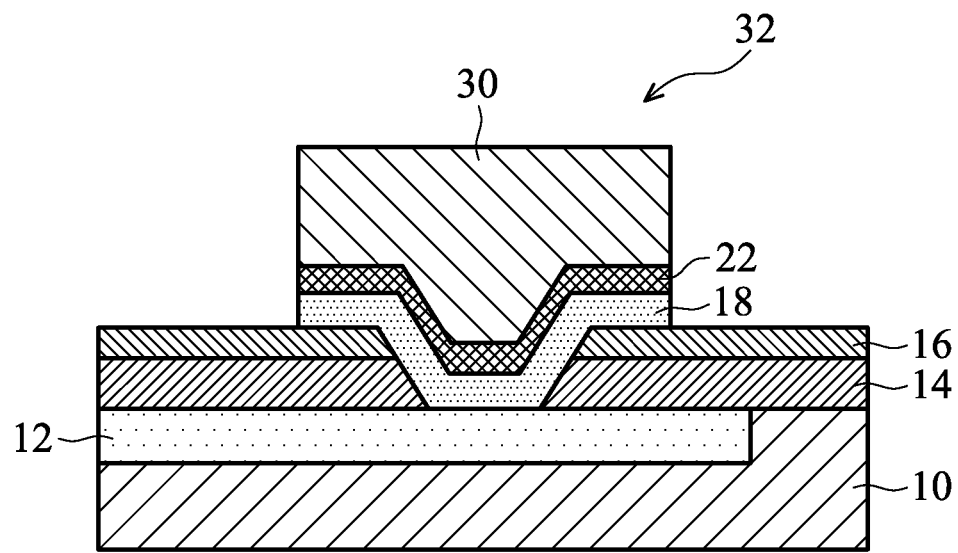

With reference to FIG. 7, the exposed portion of the first UBM layer 18 is etched back using the solder layer 30 as a mask by a conventional wet and/or dry etching process depending on the metallurgy of the first UBM metallurgy. Standard reactive ion etch (RIE) procedures can be used to etch the first UBM layer 18. A solder reflow process may be optionally performed on the solder layer 30. The substrate 10 is then sawed and packaged onto a package substrate, or another die, with solder balls or Cu bumps mounted on a pad on the package substrate or the other die.

The completed bump structure 32 includes the first UBM layer 18, the second UBM layer 22 and the solder layer 30, in which the second UBM layer 22 is a Cu layer containing Pd elements. Compared with conventional bump processes, this disclosure provides a method of selectively forming the second UBM layer 22 by an electroless Cu deposition process after the formation of the mask layer 20. There is no need to perform a wet etching process on the second UBM layer 22 after stripping the mask layer 20, thus the resulted UBM scheme has an undercut-free profile.

Figure 8:
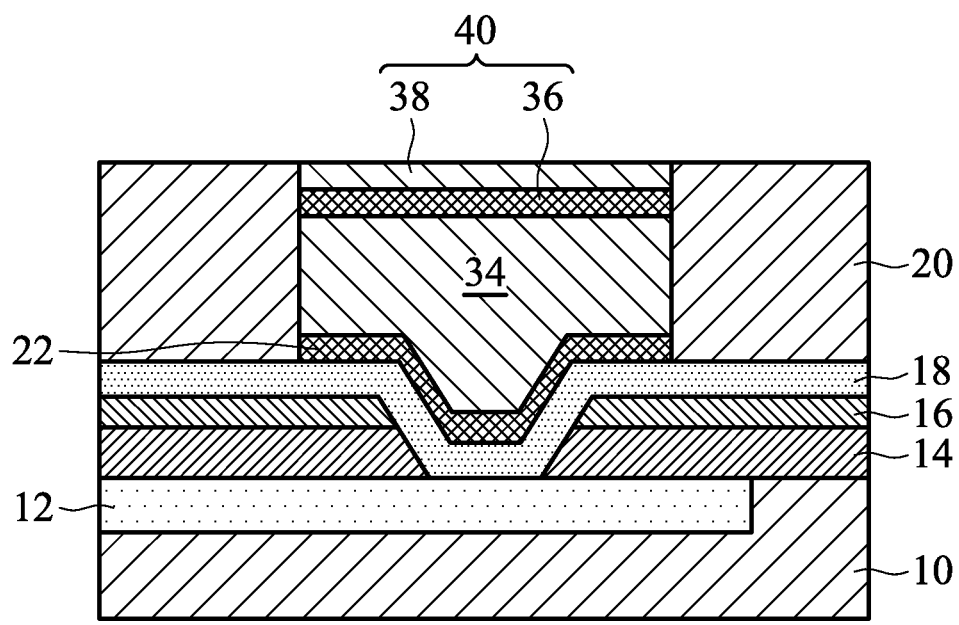
FIGS. 8 to 10 are cross-sectional diagrams depicting an exemplary embodiment of forming a Cu post bump structure without UBM undercut.
Figure 9:
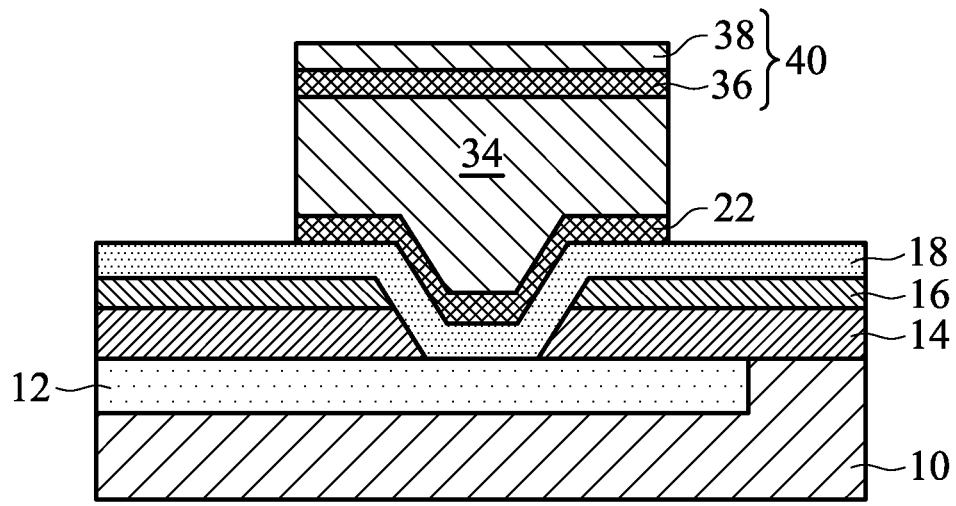
Figure 10:
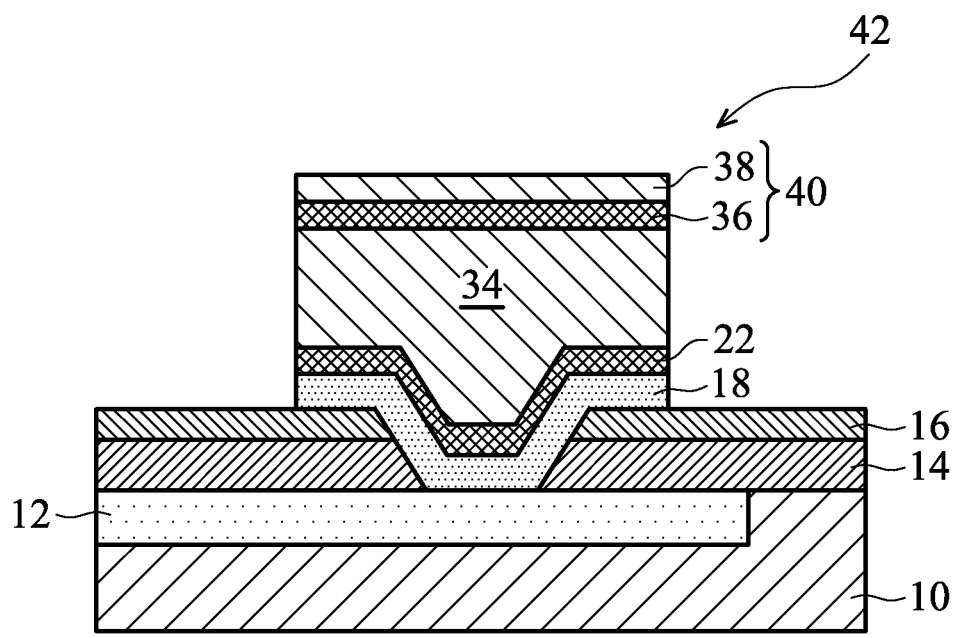

FIGS. 8 to 10 are cross-sectional diagrams depicting an exemplary embodiment of forming a Cu post bump structure without UBM undercut, while explanation of the same or similar portions to the description in FIGS. 1 to 7 will be omitted.

After the formation of the second UBM layer 22 as depicted in FIG. 4, the opening 21 is then partially filled with a conductive material with solder wettability. With reference to FIG. 8, a copper (Cu) layer 34 is formed in the opening 21 to contact the underlying second UBM layer 22. The Cu layer 34 is intended to include substantially a layer including pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium. The formation methods may include sputtering, printing, electro plating, electroless plating, and commonly used chemical vapor deposition (CVD) methods. For example, electro-chemical plating (ECP) is carried out to form the Cu layer 28. In an exemplary embodiment, the thickness of the Cu layer 34 is greater than 30 um. In another exemplary embodiment, the thickness of the Cu layer 34 is greater than 40 um. For example, the Cu layer 34 is of about 40~50 um thickness, or about 40~70 μm thickness, although the thickness may be greater or smaller. The Cu layer 34 is referred to as a Cu post 34 hereinafter.

Next, a cap layer 40 is formed on the top surface of the Cu post 34. The cap layer 36 could act as a barrier layer to prevent copper in the Cu post 34 to diffuse into bonding material, such as solder alloy, that is used to bond the substrate 10 to external features. The prevention of copper diffusion increases the reliability and bonding strength of the package. The cap layer 34 may include nickel, tin, tin-lead (SnPb), gold (Au), silver, palladium (Pd), In, nickel-palladium-gold (NiPdAu), nickel-gold (NiAu), other similar materials, or alloys. The cap layer 34 is a multi-layered structure or a single-layered structure. In some embodiments as depicted in FIG. 8, the cap layer 40 includes a first cap layer 36 and a second cap layer 38. The first cap layer 36 is a nickel layer with a thickness about 1~5 um. The second cap layer 38 is a solder layer or a gold (Au) layer.

Next, as shown in FIG. 9, the mask layer 20 is removed, exposing a portion of the first UBM layer 18. The exposed portion of the first UBM layer 18 is etched back using the Cu post 34 and the cap layer 40 as a mask by a conventional wet and/or dry etching process depending on the metallurgy of the first UBM metallurgy, as shown in FIG. 10. A solder reflow process may be optionally performed depending on the material of the cap layer 40. The substrate 10 is then sawed and packaged onto a package substrate, or another die, with solder balls or Cu bumps mounted on a pad on the package substrate or the other die.

The completed bump structure 42 includes the first UBM layer 18, the second UBM layer 22, the Cu post 34, and the cap layer 40, in which the second UBM layer 22 is a Cu layer containing Pd elements. Compared with conventional bump processes, this disclosure provides a method of selectively forming the second UBM layer 22 by an electroless Cu deposition process after the formation of the mask layer 20. There is no need to perform a wet etching process on the second UBM layer 22 after stripping the mask layer 20, thus the resulted UBM scheme has an undercut-free profile.

In the preceding detailed description, the disclosure is described with reference to specific exemplary embodiments thereof. It will, however, be evident that various modifications, structures, processes, and changes may be made thereto without departing from the broader spirit and scope of the disclosure, as set forth in the claims. The specification and drawings are, accordingly, to be regarded as illustrative and not restrictive. It is understood that the disclosure is capable of using various other combinations and environments and is capable of changes or modifications within the scope of the inventive concepts as expressed herein.

What is claimed is:

1. A method of forming a semiconductor device, comprising:
    providing a substrate;
    forming a first under-bump metallurgy (UBM) layer on the substrate;
    forming a mask layer on the first UBM layer, wherein the mask layer has an opening exposing a portion of the first UBM layer;
    performing an electroless plating process to form a second UBM layer on the exposed portion of the first UBM layer within the opening of the mask layer, wherein performing the electroless plating comprises forming a layer of palladium over the first UBM layer and plating a copper layer over the layer of palladium;
    forming a solder layer overlying the second UBM layer within the opening of the mask layer;
    removing the mask layer;
    removing the first UBM layer not covered by the solder layer; and
    forming a Cu post between the second UBM layer and the solder layer within the opening of the mask layer, wherein the Cu post and the second UBM layer have sidewalls that are substantially coplanar to each other, and wherein an entirety of the solder layer and the Cu post have sidewalls that are substantially coplanar to each other.

2. The method of claim 1, wherein the second UBM layer comprises a copper layer.

3. The method of claim 1, wherein the electroless plating process comprises removing an oxide from the first UBM layer prior to forming the layer of palladium.

4. The method of claim 1, further comprising forming a polymer layer between the first UBM layer and the substrate.

5. The method of claim 1, further comprising forming a cap layer on the Cu post within the opening of the mask layer.

6. The method of claim 5, wherein the cap layer comprises a nickel layer formed on the Cu post.

7. The method of claim 5, wherein the cap layer comprises a nickel layer formed on the Cu post, and a gold layer formed on the nickel layer.

8. The method of claim 1, wherein the first UBM layer comprises a titanium layer.

9. The semiconductor device of claim 1, wherein the copper post has a thickness greater than 30 microns (μm).

10. A semiconductor device, comprising:
    a semiconductor substrate;
    a first under-bump metallurgy (UBM) layer having first sidewalls formed on the semiconductor substrate;
    a second UBM layer having second sidewalls formed on the first UBM layer, wherein the first sidewalls and second sidewalls are substantially coplanar, and the second UBM layer comprises palladium;

a copper post formed on the second UBM layer;

a nickel layer formed on the copper post, the copper post separating the nickel layer from the second UBM layer; and a solder layer formed on the nickel layer, wherein the copper post and the second UBM layer have sidewalls that are substantially coplanar to each other, and wherein an entirety of the solder layer and the copper post have sidewalls that are substantially coplanar to each other.

11. The semiconductor device of claim 10, wherein the first UBM layer comprises a copper layer.

12. The semiconductor device of claim 10, wherein the first UBM layer comprises a titanium layer.

13. The semiconductor device of claim 10, wherein the second UBM layer has a non-undercut profile.

14. The semiconductor device of claim 10, wherein the copper post has a thickness greater than 30 microns (μm).

15. The semiconductor device of claim 10, further comprising a gold layer formed on the nickel layer.

16. A semiconductor device, comprising:

a semiconductor substrate;

a first under-bump metallurgy (UBM) layer having first sidewalls formed on the semiconductor substrate;

a second UBM layer having second sidewalls formed on the first UBM layer, wherein the first sidewalls and second sidewalls are substantially coplanar, and the second UBM layer comprises copper and palladium;

a copper post formed on the second UBM layer; and a nickel layer formed on the copper post, the copper post separating the nickel layer from the second UBM layer, wherein the second UBM layer is a palladium-containing copper alloy layer; and a solder layer formed over the nickel layer, and wherein an entirety of the solder nickel layer and the Cu post have sidewalls that are substantially coplanar to each other.

17. The semiconductor device of claim 16, wherein the copper post has a thickness greater than 30 microns (μm).

18. The semiconductor device of claim 16, wherein the first under-bump metallurgy (UBM) layer comprises Ti, TiN, TaN, or Ta.

19. The semiconductor device of claim 16, wherein the solder layer comprises Sn, SnAg, SnAgCu, SnAgZn, SnZn, Sn—In, Sn—Au, SnPb, SnCu, SnZnIn, SnAgSb, or Sn—Pb.

20. The semiconductor device of claim 16, wherein the second UBM layer has a non-undercut profile.

* * * * *